United States Patent
Zhang et al.

(10) Patent No.: US 9,653,674 B2
(45) Date of Patent: May 16, 2017

(54) CONTACT ELECTRIFICATION EFFECT-BASED BACK GATE FIELD-EFFECT TRANSISTOR

(71) Applicant: Beijing Institute of Nanoenergy and Nanosystems, Beijing (CN)

(72) Inventors: Chi Zhang, Beijing (CN); Wei Tang, Beijing (CN); Limin Zhang, Beijing (CN); Zhonglin Wang, Beijing (CN)

(73) Assignee: Beijing Institute of Nanoenergy and Nanosystems, Beijing (CN)

( * ) Notice: Subject to any disclaimer, the term of this patent is extended or adjusted under 35 U.S.C. 154(b) by 0 days.

(21) Appl. No.: 15/307,654

(22) PCT Filed: Aug. 12, 2015

(86) PCT No.: PCT/CN2015/086732
§ 371 (c)(1),
(2) Date: Oct. 28, 2016

(87) PCT Pub. No.: WO2016/023490
PCT Pub. Date: Feb. 18, 2016

(65) Prior Publication Data
US 2017/0054067 A1  Feb. 23, 2017

(30) Foreign Application Priority Data
Aug. 12, 2014  (CN) .......................... 2014 1 0393613

(51) Int. Cl.
*H01L 41/083* (2006.01)
*H01L 41/08* (2006.01)
(Continued)

(52) U.S. Cl.
CPC ........ *H01L 41/0805* (2013.01); *H01L 23/535* (2013.01); *H01L 29/0649* (2013.01);
(Continued)

(58) Field of Classification Search
None
See application file for complete search history.

(56) References Cited

U.S. PATENT DOCUMENTS

2008/0283875 A1* 11/2008 Mukasa ................ B82Y 10/00
257/253
2014/0084748 A1  3/2014 Wang et al.

FOREIGN PATENT DOCUMENTS

| CN | 1523678 | 8/2004 |
|---|---|---|
| CN | 103780122 | 5/2014 |
| CN | 103856096 | 6/2014 |

OTHER PUBLICATIONS

International Search Report issued in the corresponding International Application No. PCT/CN2015/086732, dated Nov. 10, 2015, 6 pages.

* cited by examiner

*Primary Examiner* — Reema Patel
(74) *Attorney, Agent, or Firm* — Hamre, Schumann, Mueller & Larson, P.C.

(57) ABSTRACT

The present invention provides a contact electrification effect-based back gate field-effect transistor. The back gate field-effect transistor includes: a conductive substrate; an insulating layer formed on a front face of the conductive substrate; a field-effect transistor assembly including: a channel layer, a drain and a source, and a gate; and a triboelectric nanogenerator assembly including: a static friction layer formed at a lower surface of the gate, a movable friction layer disposed opposite to the static friction layer and separated by a preset distance, and a second electroconductive layer formed at an outside of the movable friction layer and being electrically connected to the source; wherein, the static friction layer and the movable friction layer are made of materials in different ratings in triboelec-
(Continued)

tric series, and the static friction layer and the movable friction layer are switchable between a separated state and a contact state under the action of an external force.

15 Claims, 6 Drawing Sheets

(51) Int. Cl.
    *H01L 41/113*     (2006.01)
    *H01L 29/423*     (2006.01)
    *H01L 29/78*     (2006.01)
    *H01L 23/535*     (2006.01)
    *H01L 29/06*     (2006.01)
    *H01L 29/36*     (2006.01)

(52) U.S. Cl.
    CPC ............ *H01L 29/36* (2013.01); *H01L 29/423* (2013.01); *H01L 29/42356* (2013.01); *H01L 29/78* (2013.01); *H01L 41/083* (2013.01); *H01L 41/113* (2013.01)

CONTACT ELECTRIFICATION EFFECT-BASED BACK GATE FIELD-EFFECT TRANSISTOR

TECHNICAL FIELD

The present invention relates to the field of nano electronics and electronic components, and in particular, to a contact electrification effect-based back gate field-effect transistor.

BACKGROUND

Field-effect transistor is a transistor device which controls a current transport process in the element by a gate voltage. Back gate SOI structure-based metal-oxide-semiconductor field-effect transistor (MOSFET) has advantages of simple structure, low electrical field, high transconductance and good short-groove characteristics, and its back substrate can be used as the back gate while a back gate voltage is used to regulate and control a width of the conductive groove. Technology of the field-effect transistor is very mature, however, due to three-terminal construction of the device, a gate supply is required to be provided exclusively and its integration is complicated. Moreover, pressure sensing devices based on this type of field-effect transistor lack a direct interaction mechanism between external environment and the electronic devices.

Piezoelectric effect is a phenomenon of internal potential when a piezoelectric material is deformed under stress. For zinc oxide, gallium nitride, cadmium sulfide and other piezoelectric semiconductor materials, the piezoelectric effect can change transport properties of the interface barrier and p-n junction of metal semiconductor, which is the piezotronic effect. The piezotronic effect is actually a combination of a piezoelectric effect and a semiconductor effect. The piezotronic effect is used to convert the mechanical action applied to the device into local electronic control signal to achieve an improved method of regulating the piezo-potential as gate voltage, driving and controlling the electronic devices, micro nano mechanical devices and sensors by strain, stress or pressure.

Piezotronic transistor and traditional field-effect transistor have different working principles and structures. In principle, the traditional field effect transistor uses an external-applied voltage as control signal, while the piezotronic transistor produces electrical control signal by mechanical deformation. In the structure, the traditional field effect transistor is a three-terminal device, while the piezotronic transistor is a two-terminal device which has a virtual third terminal replaced by an external-applied pressure, to achieve the control of the transmission characteristics. These characteristics of the piezotronic transistor can reduce the gate electrode in the traditional transistor, and achieve a direct interaction between mechanical pressure and electronic devices, and its application scope will include artificial intelligence, human-computer interaction, biological medical, communication and the likes. However, the piezoelectric electronics transistor must be prepared by piezoelectric material, and, the regulation property of its produced piezo-potential and material selection and applications are subject to many restrictions.

In recent years, Professor Zhong Lin Wang in Beijing Institute of Nanoenergy and Nanosystem, Chinese Academy of Sciences and Georgia Institute of Technology proposed a concept of triboelectric nanogenerator. The triboelectric nanogenerator is based on the triboelectrification effect and electrostatic induction. Two kinds of high molecular polymer film coated with metal electrodes are attached together to form a device. This device will have a mechanical deformation under the action of external force and thus cause mutual friction between the two layers of polymer films, resulting in charge separation and formation of a potential difference. The potential difference not only can be used for self-powered active pressure sensor, but also can be used as a control signal of semiconductor devices.

SUMMARY (→)Technical Problem to be Solved

In view of the abovementioned technical problems, the present invention provides a back gate field-effect transistor, which combines a contact electrification effect with a metal-oxide-semiconductor field-effect transistor, to achieve regulation and control of carrier transport properties in semiconductors by using an electrostatic potential generated by a triboelectric nanogenerator as a gate signal of the back gate field-effect transistor.

(⇋)Technical Solution

In the present invention, a contact electrification effect-based back gate field-effect transistor comprises: a conductive substrate 10; an insulating layer 20 formed on a front face of the conductive substrate 10; a field-effect transistor assembly 30 comprising: a channel layer 31 formed above the insulating layer 20, a drain 32 and a source 33 formed above the channel layer 31, and a gate 34 formed on a back face of the conductive substrate 10; and a triboelectric nanogenerator assembly 40 comprising: a static friction layer 41 formed at a lower surface of the gate 34, a movable friction layer 42 disposed opposite to the static friction layer 41, and a second electro-conductive layer 44 formed at an outside of the movable friction layer 42 and being electrically connected to the source 33; wherein, the static friction layer 41 and the movable friction layer 42 are made of materials which are in different ratings in triboelectric series, and the static friction layer 41 and the movable friction layer 42 are configured to be switchable between a separated state and a contact state under the action of an external force.

DETAILED DESCRIPTION OF THE EMBODIMENTS

Figure 1:
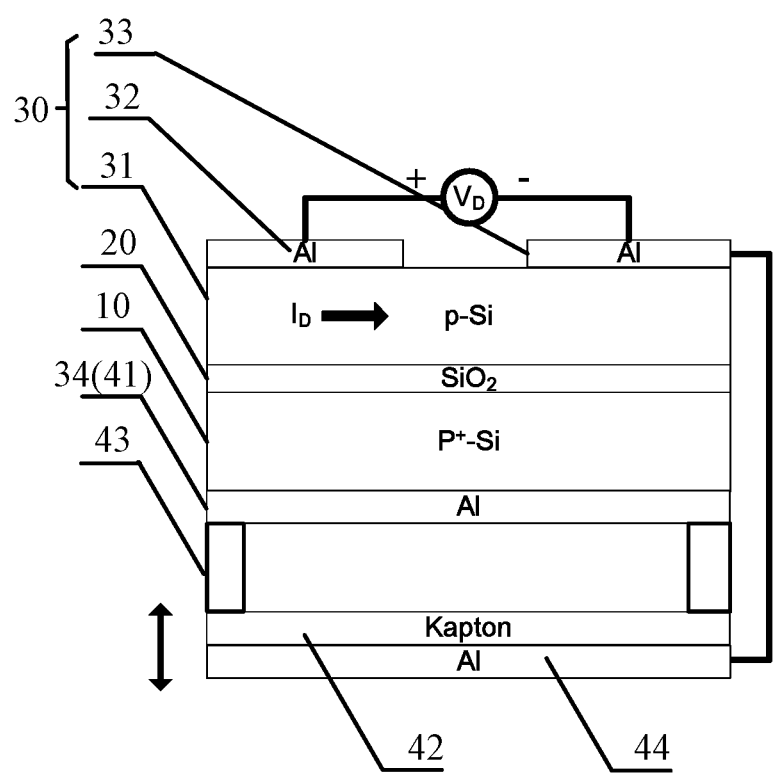
FIG. 1 is a structural schematic view of a contact electrification effect-based back gate field-effect transistor according to a first embodiment of the present invention.

In the present invention, a triboelectric nanogenerator and a back gate field-effect transistor are combined, in which one friction layer of the triboelectric nanogenerator is fixed or is integrated into one piece with a gate of the back gate field-effect transistor, and is brought to be in a contact electrification with another friction layer using an external force to generate a gate potential, so as to achieves regulation and control of carrier transport properties in semiconductors.

In order to achieve an easy understanding, mainly elements related to the present invention are firstly numbered and described. In the drawings or the description, the like or similar reference numerals refer to the like elements, in which:
- 10—conductive substrate;
- 20—insulating layer;
- 30—field-effect transistor assembly;
- 31—channel layer; 32—drain;
- 33—source; 34—gate;
- 40—triboelectricity assembly;
- 41—static friction layer; 42—movable friction layer;
- 43—elastic element; 44—second electro-conductive layer.

In order to provide a more clear understanding of objects, technique solutions and advantages of the present invention, the present invention will be further described hereinafter in detail in conjunction with specific embodiments and with reference to the attached drawings.

It should be noted that, these embodiments which are not illustrated or described in the drawings are well-known forms for those skilled in the art. In addition, although examples of parameters containing specific values may be provided in this description, it should be understood that these parameters are unnecessary to have the exactly specific value, but can have those approximate values within acceptable tolerance or design constraint. In the embodiments, orientation terminologies for example including "upper", "lower", "front", "rear", "left", "right" and the likes are those shown in the figures, and only intended for easing or simplifying the description of embodiments shown in the figures, instead of being intended to limit the scope of the present invention.

First Embodiment

In a first exemplary embodiment of the present invention, there is provided a contact electrification effect-based back gate field-effect transistor. FIG. 1 is a structural schematic view of a contact electrification effect-based back gate field-effect transistor according to a first embodiment of the present invention. Referring to FIG. 1, a contact electrification effect-based back gate field-effect transistor according to the present embodiment comprises: a conductive substrate 10; an insulating layer 20 formed on a front face of the conductive substrate 10; a field-effect transistor assembly 30 comprising: a channel layer 31 formed above the insulating layer 20, a drain 32 and a source 33 formed above the channel layer 31, and a gate 34 formed on a back face of the conductive substrate 10; and, a triboelectricity assembly 40 comprising: a static friction layer 41 formed at a lower surface of the gate 34, a movable friction layer 42 disposed opposite to the static friction layer 41, and a second electro-conductive layer 44 formed at an outside of the movable friction layer 42 and being electrically connected to the source 33; wherein, the static friction layer 41 and the movable friction layer 42 are made of materials which are in different ratings in triboelectric series, and the static friction layer 41 and the movable friction layer 42 are configured to be switchable between a separated state and a contact state under the action of an external force.

These component parts of the contact electrification effect-based back gate field-effect transistor according to the present embodiment will be described and explained in detail herein.

In the present embodiment, a SOI substrate is used, in which a Si substrate is heavily p doped and thus is served as the conductive substrate 10, and a $SiO_2$ layer located above the Si substrate is served as the insulating layer 20. The Si substrate has a thickness $h_1$ of 500 μm, and has a resistivity which is less than 0.1 Ω·cm after being heavily p doped. The $SiO_2$ layer has a thickness $h_2$ of 150 nm. Commercial available SOI substrate may be used to reduce manufacturing procedures and increase production yield.

In addition to the SOI substrate, according to embodiments of the present invention, other types of materials can be adopted to manufacture the conductive substrate 10 and the insulating layer 20. The conductive substrate 10 may be made of metallic conductors, for example, including Cu, Al, Au, Ag or Pt, or be of heavily n doped Si material, as long as its resistivity is less than 0.1 Ω·cm. The thickness $h_1$ of the conductive substrate 10 is in a range of 300 μm≤$h_1$≤1 mm. In addition, the insulating layer 20 can be made of other insulating materials, for example SiN, $Al_2O_3$ or the like. The thickness $h_2$ of the insulating layer 20 is in a range of 2 nm≤$h_2$≤200 nm.

In the present embodiment, the channel layer 31 is a Si layer which is p doped, and is also named for short as a top silicon. The top silicon 31 is formed by implementing a P type doping on a Si film. After the P type doping, the resistivity ρ of the top silicon 31 satisfies 1 Ω·cm≤ρ≤100 Ω·cm and has a thickness $h_3$ of 2 μm. In addition, the channel layer can also be other P doped semiconductor material, for example Ge and the like, and has thickness $h_3$ which is in a range of 1 μm≤$h_3$≤100 μm.

Above the channel layer 31, a drain 32 and a source 33 are manufactured by metal material Al. The contact of the source 33 and the drain 32 with the channel layer is Ohmic contact or Schottky contact. The source 33 is grounded and a voltage of the drain 32 is 5V greater than that of the source. It should be noted that, a potential difference V between the two can be adjusted reasonably by those skilled in the art, generally, the potential difference V satisfies 1V≤V≤10V.

In the present embodiment, a distance $L_i$ between the source and the drain is 200 μm, and an overlapping area $S_1$ of the source 33 and the gate 34 in a vertical direction is 200 μm×300 μm. In other embodiments of the present invention, the distance $L_1$ between the source and the drain is in a range of 100 nm≤$L_1$≤1 cm, and, the overlapping area $S_1$ of the source 33 and the gate 34 in the vertical direction is 25%-50% of that of the gate 34, generally, the overlapping area $S_1$ satisfies 100 nm×100 nm≤$S_1$≤1 cm×1 cm.

In the back face of the SOI substrate, the gate 34 is manufactured by metal material Al. A contact between the gate 34 and the heavily p doped Si substrate of the SOI substrate is Ohmic contact.

It should be understood by those skilled in the art that, in addition to material Al, the drain 32, the source 33 and the gate 34 may be manufactured by other metal materials, for example including Al, Au, Pt, Cu and the like. In addition, the drain and the source can be manufactured by non-metallic materials having metallic property, for example including indium tin oxide (ITO), aluminum doped zinc oxide (AZO) and the like.

In the present embodiment, the triboelectricity assembly 40 comprises: a static friction layer 41, a movable friction layer 42 disposed opposite to the static friction layer 41 through an elastic element 43, and a second electro-conductive layer 44 formed at an outside of the movable friction layer 42 and being electrically connected to the source 33.

In the present embodiment, the gate of the field-effect transistor is also served as the static friction layer, and the movable friction layer 42 is made of polyimide (Kapton) organic polymer material.

In the present embodiment, an elastic element made of rubber material is disposed between the static friction layer 41 and the movable friction layer 42 so that the static friction layer 41 and the movable friction layer 42 are spaced by a preset distance and are switchable between the separated state and the contact state. However, it is not intended to limit the present invention. In other embodiments, under the action of an external force, the static friction layer 41 and the movable friction layer 42 can be switchable between the separated state and the contact state, through any other manners. For example, (1) the elastic element can be a spring, or simple beam element manufactured by MEMC process;

(2) the static friction layer 41 and the movable friction layer 42 are spaced by a preset distance through elastic or non-elastic element, and are switchable between the separated state and the contact state; or (3) no connection may be adopted between the static friction layer 41 and the movable friction layer 42, only a connection element is disposed between the static friction layer 41 and the movable friction layer 42, to space the static friction layer 41 from the movable friction layer 42 by the preset distance and to make the static friction layer 41 and the movable friction layer 42 to be switchable between the separated state and the contact state under an external force. This transistor device of such configuration may be used together with other devices.

In the present embodiment, the second electro-conductive layer 44 is manufactured by material Al. It should be understood that, the second electro-conductive layer may be also manufactured by other metal or metal-like conductor materials, for example including Au, Ag, Pt, ITO, AZO and the like, and the present invention is not limited to this herein.

It should be noted that, the static friction layer and the movable friction layer are made of Al layer and polyimide organic high polymer material, respectively. However, the static friction layer and the movable friction layer can be made of two materials in different ratings in triboelectric series.

Here, the term "triboelectric series" means the order of materials for reflecting degrees of their attraction to charge. At the moment when two materials contact with each other, positive charges on the friction surface are transferred from a surface of one material that has a relatively negative rating in triboelectric series to the surface of the other material that has a relatively positive rating in triboelectric series. So far, there is no uniform theory that can interpret completely mechanism of the charge transfer. It is generally recognized that such charge transfer is related with the surface work function of a material, and the charge transfer is achieved by transfer of electrons or ions on the contact surfaces. It should be explained that the charge transfer only require two materials contact with each other, instead of being rubbed against each other. Here, the term "contact charges" means that electric charges on surfaces of two kinds of materials, which have a difference in the triboelectric series, after the contact and the friction between the two kinds of materials. It is generally recognized that the contact charges are only distributed on surfaces of the materials, with a maximum depth of about 10 nanometers. It should be explained that a symbol for the contact charge is that for net charge, that is to say, negative charge accumulation regions may appear on some parts of surface of a material carrying with positive contact charges, while the symbol for net charges on the whole surface thereof is positive.

In the present embodiment, the static friction layer 41 is also acted as the gate 34, accordingly, the static friction layer is required to be made of conductor material. Compared with an insulator, a conductor possesses the triboelectric property of being prone to lose electrons and is often at the end of a list of triboelectric series. Commonly used conductors comprise metal, conductive oxide or conductive polymer. Here, the metal includes gold, silver, platinum, aluminum, nickel, copper, titanium, chromium or selenium, or any alloy thereof. The conductive oxide usually includes indium tin oxide, AZO, ITO or the like. Since conductive material itself can be used as a conductive element, the conductive element and the static friction layer can be used as one when the conductive material is used as the static friction layer.

In the present embodiment, in addition to be made of polyimide (Kapton) organic high polymer material, the movable friction layer may also be made of any other materials, including conductors, insulating materials or the like, which are charged negatively after being contacted the first friction material. Here, the conductors can be any conductor materials different from the material for the static friction layer 41. As to the insulating materials, some frequently-used insulating materials are listed herein according to the order of triboelectric series from positive to negative: aniline formaldehyde resin, polyformaldehyde, ethyl cellulose, polyamide 11, polyamide 6-6, woven fabric and wool, silk and its fabric, paper, polyethylene glycol two Ding ester, cellulose, cellulose acetate, polyethylene glycol adipate, poly (diallyl phthalate), regenerated cellulose sponge and cotton fabrics, polyurethane elastomer, styrene acrylonitrile copolymer, styrene-butadiene copolymer, wood, hard rubber, synthetic fiber, acetate, poly (methyl methacrylate), polyvinyl alcohol, polyester (PET), polyisobutylene, polyurethane sponge, polyethylene glycol terephthalate, polyvinyl butyral, butadiene acrylonitrile copolymer, chloroprene rubber, natural rubber, polyacrylonitrile, poly (vinylidene chloride-co-acrylonitrile), polybisphenol A carbonate, chlorinated polyether, polyvinylidene chloride, poly (2,6-dimethyl phenylene oxide), polystyrene, polyethylene, polypropylene, polydiphenylpropane carbonate, polyethylene glycol terephthalate, polyimide, poly (vinyl chloride), polydimethylsiloxane, poly chlorotrifluoroethylene, PTFE, Perry forest, including Perry Lin C, Perry forest N, Perry Lin D, Perry Lin HT and Perry Lin AF4.

In addition, since the semiconductor material and the metal have different triboelectric properties, the semiconductor material can be used as material for the movable friction layer. Commonly-used semiconductors includes silicon, germanium, group III and V compounds for example including gallium arsenide, gallium phosphide and the like, group II and VI compounds for example including cadmium sulfide, zinc sulfide and the like, solid solution composed of group III-V compounds and group II-VI compounds, for example including gallium aluminum arsenide, GaAsP and the like. In addition to the abovementioned crystalline semiconductors, amorphous glass semiconductor, organic semiconductor and the like may also be included. Nonconductive oxide, semiconductor oxide and complex oxide can also be used as the movable friction layer of the present invention since they also have triboelectric properties of producing surface charges in the friction process, for example, including manganese-, chromium-, iron- and copper-oxides, and also including silicon oxide, manganese oxide, chromium oxide, iron oxide, copper oxide, zinc oxide, $BiO_2$ and $Y_2O_3$.

Due to length of the description, it is not exhaustive of all possible materials, and here only several specific materials are provided for reference. Apparently, the present invention is not limited to these specific materials, because other similar materials may be chosen by those skilled in the art according to triboelectric properties of these materials, with the inspiration of the present invention.

Figure 2:
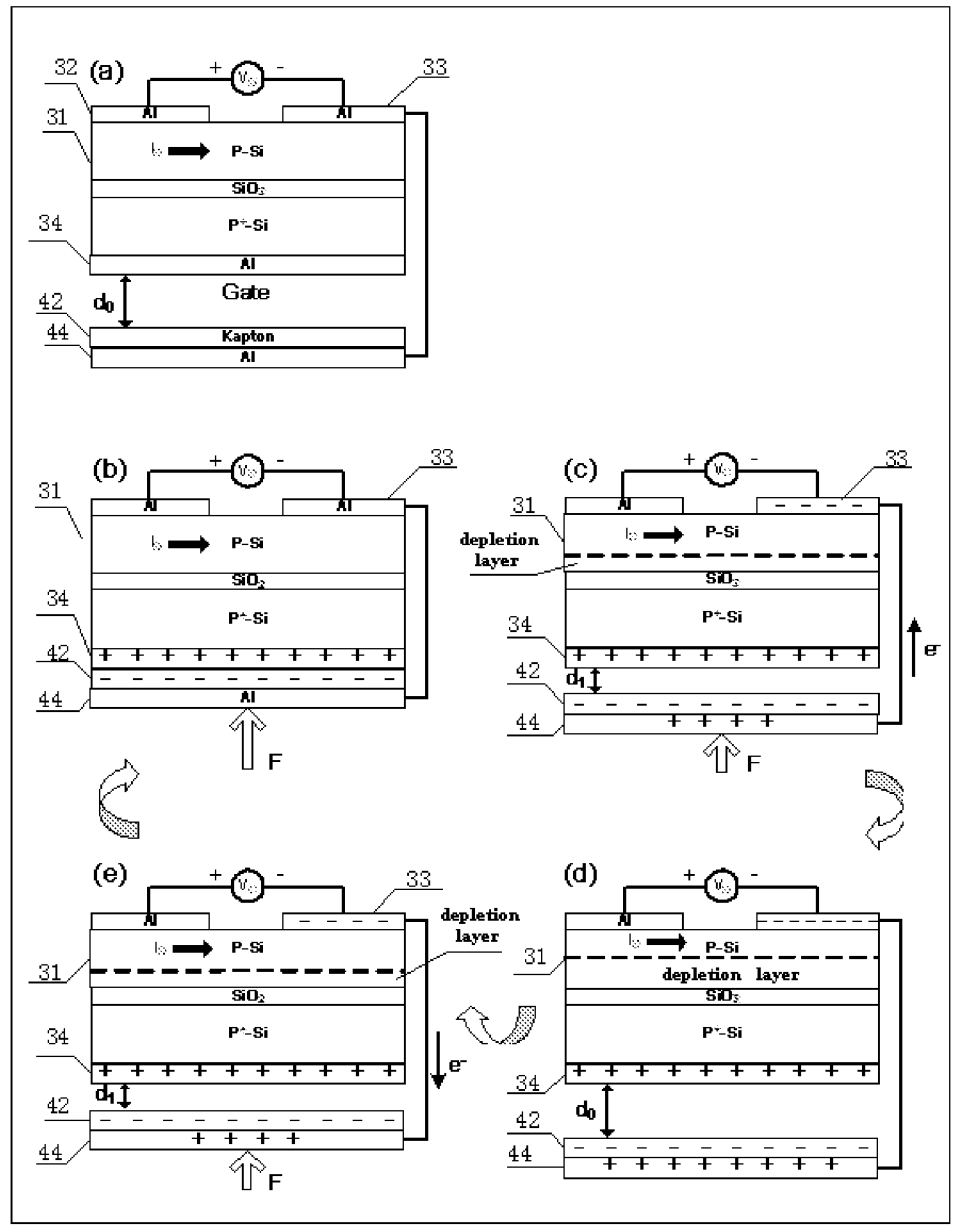
FIG. 2 is a working principle diagram of the back gate field-effect transistor shown in FIG. 1.

FIG. 2 is a working principle diagram of the back gate field-effect transistor shown in FIG. 1. Working principle of the field-effect transistor according to the present embodiment will be explained with reference to FIG. 2, hereinafter.

1. Referring to (a) in FIG. 2, the gate 34 and the movable friction layer 42 form a pair of friction faces and has a distance $d_0$ between them at an initial state, and, the drain 32 and the source 33 are connected to an external power source to generate a current $I_D$ in the channel layer 31.

2. Referring to (b) in FIG. 2, under the action of an external force F, the movable friction layer 42 goes into contact with and is rubbed with the gate 34. Due to different electron binding capacities, the movable friction layer 42 is negatively charged while the gate 34 is positively charged.

3. Referring to (c) in FIG. 2, when the external force F is gradually being removed, the movable friction layer 42 is gradually being separated from the gate 34 and a distance between the two is $d_1 (d_1 < d_0)$. In this process, electrons are flowed from the second electro-conductive layer 44 to the source 33 so as to reach an electric equilibrium. The source 33 is negatively charged and, together with the gate 34, produces an internal electric field in a vertical direction.

4. Referring to (d) in FIG. 2, when the external force F is completed removed, the movable friction layer 42 is completely separated from the gate 34 and the distance between the two goes back to $d_0$. Here, negative charges carried by the source 33 are almost equal to the gate 34, so that an electric equilibrium is reached and a maximum internal electric field in the vertical direction is obtained. In this process, the channel layer 31 owns polarization charges, so that a lower surface of the channel layer 31 attracts the electrons but repels the positive holes to produce a depletion layer, which reduces a width of the conductive groove in the channel layer 31, thereby reducing the current $I_D$ in the channel layer 31 and performing regulation and control of carrier transport properties in semiconductors.

5. Referring to (e) in FIG. 2, when an external force F is applied again, the movable friction layer 42 is gradually approaching the gate 34 and the distance between the two becomes $d_1 (d_1 < d_0)$. In this process, electrons are flowed from the source 33 to the second electro-conductive layer 44 so as to reach an electric equilibrium. Negative charges carried by the source 33 are gradually being reduced and thus the internal electric field in a vertical direction, produced between the source and the gate 34 is being reduced gradually. In this process, the width of the conductive groove in the channel layer 31 is increased and the current $I_D$ is increased.

In a next cycle, the movable friction layer 42 goes into contact with the gate 34 again, when the external force F is applied. Negative charges carried by the source 33 almost go back to the second electro-conductive layer 44, so as to reach an electric equilibrium. The internal electric field perpendicular to the current $I_D$ goes to its minimum, namely it goes back to the state shown in (b) of FIG. 2.

From the above description regarding the principles, it is learned that, in the contact electrification effect-based back gate field-effect transistor according to the present embodiment, external force F can regulate and control intensity of an electrostatic field perpendicular to the current direction in semiconductors and function as a gate voltage, achieving regulation and control of the electric current in semiconductors.

In the present embodiment, thickness of the insulating layer 20 is greatly less than that of the top silicon 31 and the SOI substrate 10 has a very low resistivity, accordingly, the gate voltage increases with the increase of the distance between the movable friction layer 42 and the gate 34, and a maximum value of the produced gate voltage can be approximately represented by:

$$V_G = \frac{Q_0 \cdot \varepsilon_K \cdot d_0 \cdot d_{Si}}{\varepsilon_{Si} \cdot S_1 \cdot (\varepsilon_K \cdot d_0 + \varepsilon_0 \cdot d_K)} \qquad (1)$$

where, $Q_0$ and $d_0$ are respectively an amount of charges and a separated distance during the contact friction between the movable friction layer 42 and gate 34, $S_1$ is an overlapping area of the source 33 and the gate 34 in a vertical direction, $d_{Si}$ and $\in_{Si}$ are respectively thickness and dielectric constant of the top silicon 31, and $\in_0$ is dielectric constant of the air.

Figure 3:
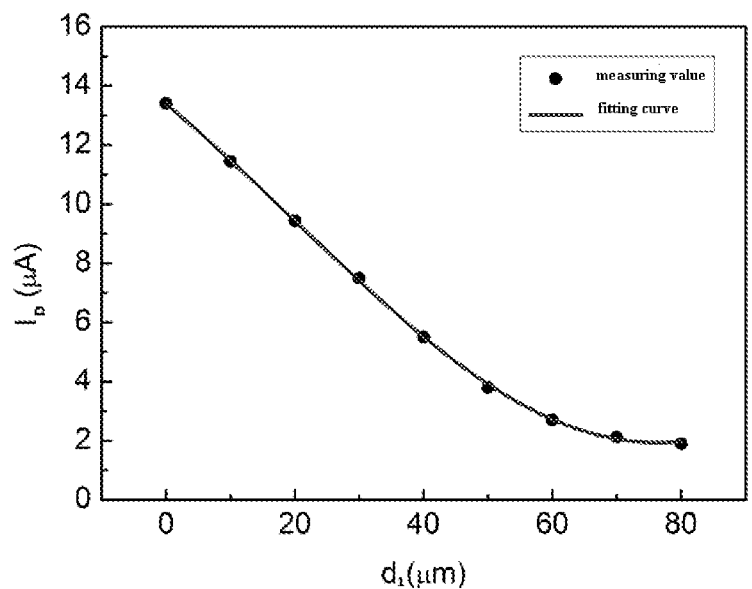
FIG. 3 is a curve of a source-drain current $I_D$ in dependence on a distance $d_1$ between a movable friction layer and a gate when a source-drain voltage $V_D$ is 5V, in the back gate field-effect transistor shown in FIG. 1.

FIG. 3 is a curve of a source-drain current $I_D$ vs a distance $d_1$ between a movable friction layer and a gate at a source-drain voltage $V_D$ of 5V, in the back gate field-effect transistor shown in FIG. 1. In FIG. 3, horizontal ordinate represents a distance between two separated friction layers and longitudinal ordinate represents electrical current passing through the channel layer. It can be seen that, as the distance $d_1$ between the static friction layer and the gate increases, the current passing through the channel layer gradually decreases. Through the reciprocating motion between the two friction layers, potential difference is produced between the source and the gate, which changes a channel width of the channel layer, functioning to adjust electric current between the source and the drain.

In the present invention, a preset distance L separated between the static friction layer 41 and the movable friction layer 42 is in a range, preferably of 0≤L≤800 μm, and more preferably of 0≤L≤80 μm.

It should be note that, the abovementioned static friction layer and movable friction layer are relative to each other, one of the two friction layers is treated as the static friction layer while the other is treated as the movable friction layer, and they do not indicate "static" and "movable" in the ordinary sense.

From the above description regarding this embodiment, it can be seen that, in the back gate field-effect transistor according to this embodiment, an electrostatic potential generated in a triboelectric nanogenerator, instead of supply voltage of a gate electrode in traditional transistor, is used as a gate signal, to achieve a direct interaction between mechanical pressure and electronic device. Meanwhile, it has simple structure, is easy to manufacture and integrate, facilitates miniaturization and array of the device, has wide material choices, and possesses lots of advantages than prior art piezoelectric transistor.

Second Embodiment

Figure 4:
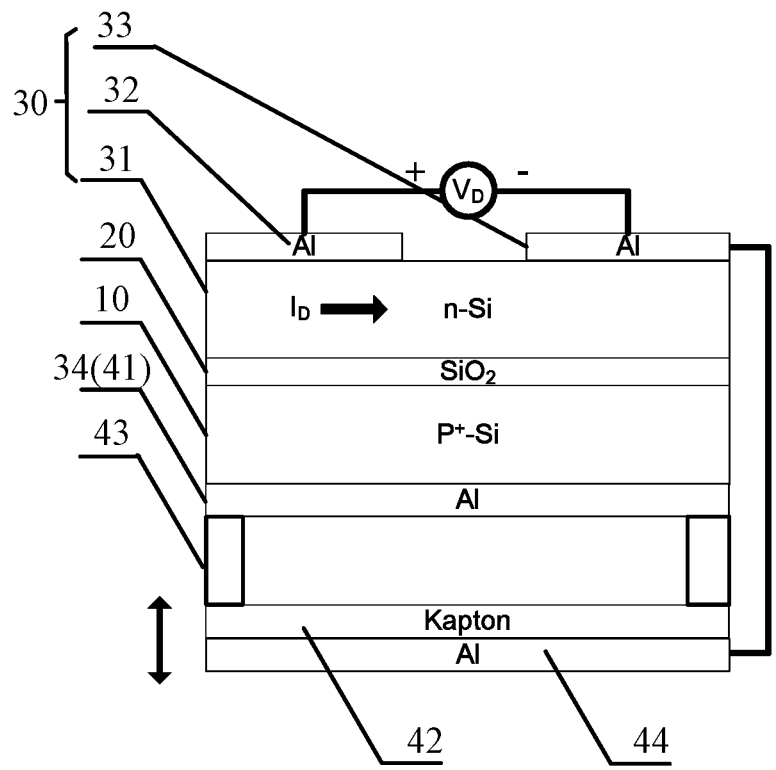
FIG. 4 is a structural schematic view of a contact electrification effect-based back gate field-effect transistor according to a second embodiment of the present invention.

In a second exemplary embodiment of the present invention, there is provided another contact electrification effect-based back gate field-effect transistor. FIG. 4 is a structural schematic view of a contact electrification effect-based back gate field-effect transistor according to a second embodiment of the present invention. Referring to FIG. 4, structure and construction described in this embodiment are similar to those in the first embodiment, and the difference is only in that, the channel layer 31 is made of Si material with N type doping.

It should be understood by those skilled in the art that, change trend of the current of the back gate field-effect transistor in the present embodiment is the reverse of the curve shown in FIG. 3, that is, as the distance between the movable friction layer and the static friction layer increases, the current passing through the channel layer gradually increases.

Common points between the present embodiment and the first embodiment lie in, the movable friction layer of the triboelectric nanogenerator is served as a pressure bearing part, and the SOI substrate, the gate, the source and the like do not bear the pressure directly, and an elastic element can be used to connect between the movable friction layer and the SOI substrate. Accordingly, the back gate field-effect transistor entirely can bear great mechanical deformation, and has much more wide ranges of external force sensing and of choices on semiconductor material compared to piezoelectric transistor.

Third Embodiment

Figure 5:
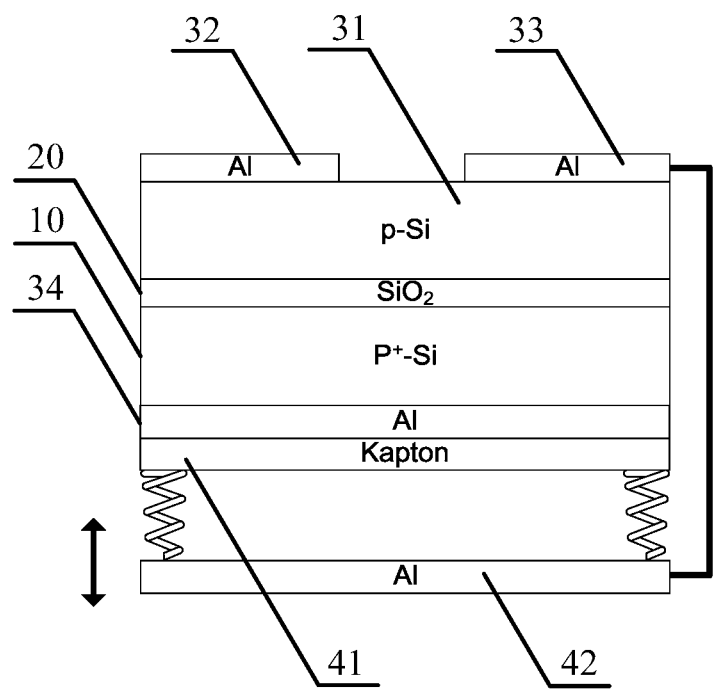
FIG. 5 is a structural schematic view of a contact electrification effect-based back gate field-effect transistor according to a third embodiment of the present invention.

In a third exemplary embodiment of the present invention, there is also provided another contact electrification effect-based back gate field-effect transistor. FIG. 5 is a structural schematic view of a contact electrification effect-based back gate field-effect transistor according to a third embodiment of the present invention. Referring to FIG. 5, structure and construction described in this embodiment are similar to those in the first embodiment, and the differences are in that, the static friction layer is made of polyimide high polymer material and is fixed to the gate 34, and the movable friction layer is an aluminum sheet which is isolated elastically from the static friction layer by insulating material, in addition, the aluminum sheet is electrically connected via wires to the source 33.

Figure 6:
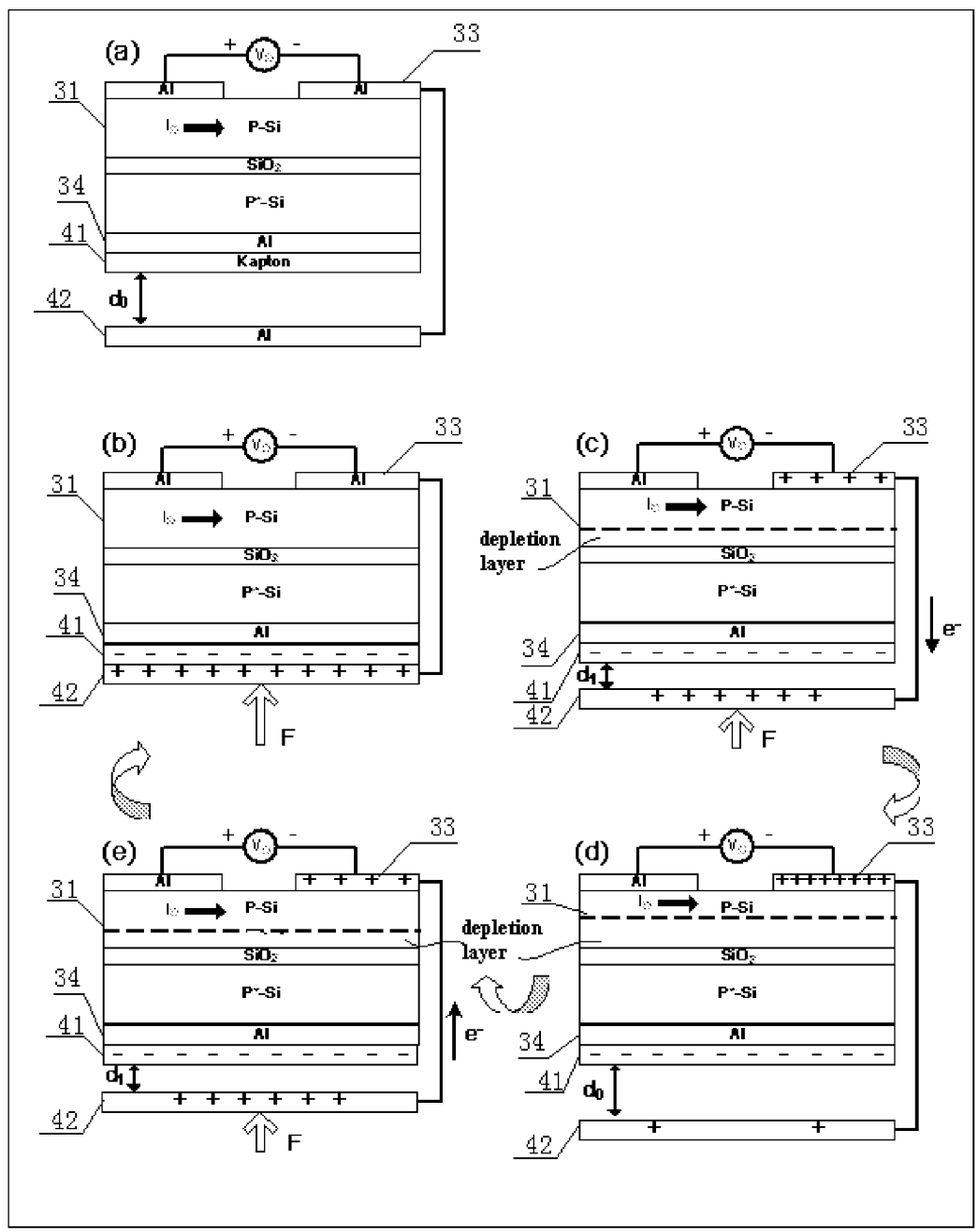
FIG. 6 is a working principle diagram of the back gate field-effect transistor shown in FIG. 5.

FIG. 6 is a working principle diagram of the back gate field-effect transistor shown in FIG. 5. Working principle of the field-effect transistor according to the present embodiment will be explained with reference to FIG. 6, hereinafter.

1. Referring to (a) in FIG. 6, the movable friction layer 42 and a polyimide high polymer film 41 form a pair of friction faces and has a distance $d_0$ between them at an initial state, and, the drain 32 and the source 33 are connected to an external power source to generate a current $I_D$ in the channel layer 31.

2. Referring to (b) in FIG. 6, under the action of an external force F, the movable friction layer 42 goes into contact with and is rubbed with the static friction layer 41. Due to different electron binding capacities, the static friction layer 41 is negatively charged while the movable friction layer 42 is positively charged.

3. Referring to (c) in FIG. 6, when the external force F is gradually being removed, the movable friction layer 42 is gradually being separated from the static friction layer 41 and a distance between the two is $d_1 (d_1 < d_0)$. In this process, electrons are flowed from the source 33 to the second electro-conductive layer 44 so as to reach an electric equilibrium. The source 33 is positively charged and, together with the static friction layer 41, produces an internal electric field in a vertical direction.

4. Referring to (d) in FIG. 6, when the external force F is completed removed, the static friction layer 41 is completely separated from the movable friction layer 42 and the distance between the two goes back to $d_0$. Here, positive charges carried by the source 33 are almost equal to the movable friction layer 42, so that an electric equilibrium is reached and a maximum internal electric field in the vertical direction is achieved. In this process, the channel layer 31 owns polarization charges under the action of the internal electric field, so that a lower surface of the channel layer 31 attracts the positive holes but repels the electrons to produce a reinforcement layer, which increases a carrier concentration in the channel layer 31, thereby increasing the current $I_D$ in the channel layer 31 and performing regulation and control of carrier transport properties in semiconductors.

5. Referring to (e) in FIG. 6, when an external force F is applied again, the movable friction layer 42 is gradually approaching the static friction layer 41 and the distance between the two becomes $d_1 (d_1 < d_0)$. In this process, electrons are flowed from the movable friction layer 42 to the source 33 so as to reach an electric equilibrium. Positive charges carried by the source 33 are gradually being reduced and thus the internal electric field in the vertical direction, produced between the source and the static friction layer 41 is being reduced gradually. In this process, the width of the conductive groove in the channel layer 31 is decreased and the current $I_D$ is decreased.

6. When the external force F is applied completely, the movable friction layer 42 has contacted the movable friction layer 42 again, positive charges carried by the source 33 almost go back to the movable friction layer 42, so as to reach an electric equilibrium. The internal electric field perpendicular to the direction of the current $I_D$ goes to its minimum, namely it goes back to the state shown in (b) of FIG. 6. Therefore, external force F can regulate and control an electrostatic field perpendicular to the current direction in semiconductors and function as a gate voltage, achieving regulation and control of the electric current in semiconductors.

In the back gate field-effect transistor of the present embodiment, thickness of the silicon dioxide insulating layer 20 is greatly less than that of the channel layer 31 and the SOI substrate 10 has a very low resistivity, accordingly, for an enhanced mode, and a maximum value of the produced gate voltage caused by the external force F can be approximately represented by:

$$V_G = -\frac{Q_0 \cdot \varepsilon_K \cdot d_0 \cdot d_{Si}}{\varepsilon_{Si} \cdot S_1 \cdot (\varepsilon_K \cdot d_0 + \varepsilon_0 \cdot d_K)} \quad (2)$$

in which, $Q_0$ and $d_0$ are respectively an amount of charges and a separated distance in the contact friction between the static friction layer 41 and the movable friction layer 42, $S_1$ is an overlapping area of the source 33 and the gate 34 in a vertical direction, $d_K$ and $\varepsilon_K$ are respectively thickness and dielectric constant of the static friction layer 41, $d_{Si}$ and $\varepsilon_{Si}$ are respectively thickness and dielectric constant of the channel layer 31, and $\in_0$ is dielectric constant of the air.

Figure 7:
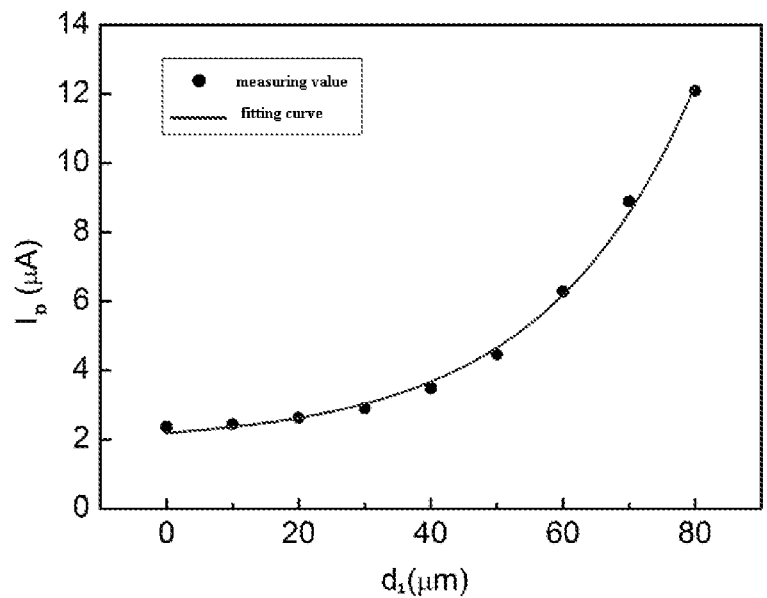
FIG. 7 is a curve of a source-drain current $I_D$ in dependence on a distance $d_1$ between a movable friction layer and a gate when a source-drain voltage $V_D$ is 5V, in the back gate field-effect transistor shown in FIG. 5.

FIG. 7 is a curve of a source-drain current $I_D$ to a distance $d_1$ between a movable friction layer and a gate once a source-drain voltage $V_D$ is 5V, in the back gate field-effect transistor shown in FIG. 5. From FIG. 7, it can be seen that, as the distance $d_1$ between the movable friction layer and the static friction layer increases, the current passing through the channel layer gradually increases. Through the reciprocating motion between the two friction layers, potential difference is produced between the source and the gate, which changes a channel width of the channel layer, functioning to adjust electric current between the source and the drain.

In the present invention, a preset distance separated between the static friction layer 41 and the movable friction layer 42 is in a range preferably of 0-800 micrometer, and more preferably of 0-80 micrometer.

Fourth Embodiment

Figure 8:
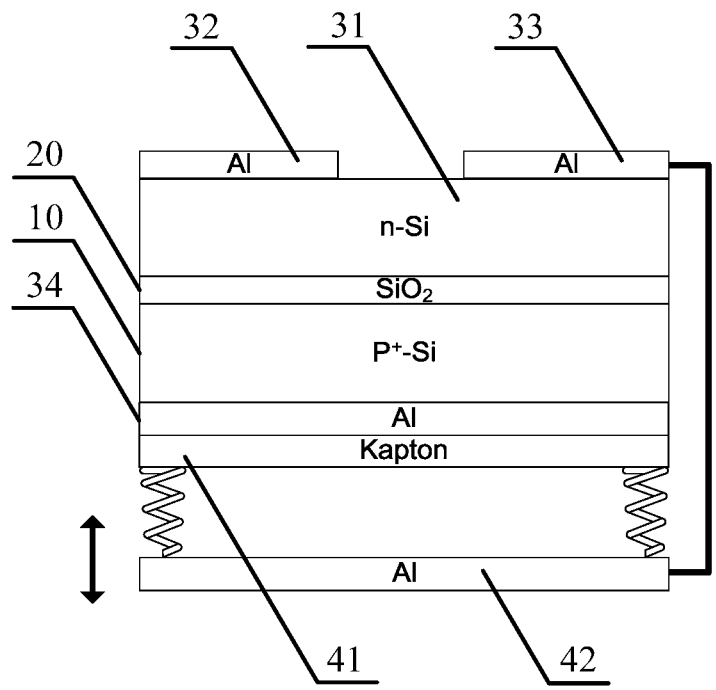
FIG. 8 is a structural schematic view of a contact electrification effect-based back gate field-effect transistor according to a fourth embodiment of the present invention.

In a fourth exemplary embodiment of the present invention, there is further provided another contact electrification effect-based back gate field-effect transistor. FIG. 8 is a structural schematic view of a contact electrification effect-based back gate field-effect transistor according to a fourth embodiment of the present invention. Referring to FIG. 8, structure and construction described in this embodiment are similar to those in the third embodiment, and the differences are in that, the channel layer 31 is made of Si material which is N doped.

It should be understood by those skilled in the art that, change trend of the current of the back gate field-effect transistor in the present embodiment is the reverse of the curve shown in FIG. 7, that is, as the distance between the movable friction layer and the static friction layer increases, the current passing through the channel layer gradually increases.

So far, four embodiments of the present invention are described in detail in conjunction with the attached drawings. With the above description, those skilled in the art have a clear understanding of the contact electrification effect-based back gate field-effect transistor according to the present invention.

In addition, the abovementioned definitions on these elements and method processes are not limited to these specific structures, shapes or processes mentioned in these embodiments, and those skilled in the art may implement any simple alterations or replacements thereto.

Concerning the above, the contact electrification effect-based back gate field-effect transistor according to the present invention combines a triboelectric nanogenerator with a metal-oxide-semiconductor field-effect transistor. One friction layer of the triboelectric nanogenerator is fixed or is integrated into one piece with a gate of the back gate field-effect transistor, and is brought to be in a contact electrification with another friction layer using an external force to generate a gate potential, so as to achieve regulation and control of carrier transport properties in semiconductors. It has advantages of good regulation and control properties, wide sensing range, easy manufacturing and integration, and can be widely applied in the fields including sensors, human-computer interaction, microelectromechanical system, nano robot, flexible electronics and the like, and thus has good application prospects.

Purposes, technical solutions and advantages of the present invention have been further illustrated in the above specific embodiments. It should be understood that the above description is merely used to illustrate specific embodiments of the present invention, but not to limit the present invention. All of changes, equivalent alternatives, improvements, made within principles and spirit of the present invention, should be included within the scope of the present invention.

Advantages

Seen from the abovementioned technical solution, the contact electrification effect-based back gate field-effect transistor according to the present invention has the following advantages.

(1) A back gate field-effect transistor is combined with a contact electrification effect, to achieve regulation and control of carrier transport properties in semiconductors by using an electrostatic potential generated in a triboelectric nanogenerator as a gate signal, and to have good regulation and control properties.

(2) An electrostatic potential generated in a triboelectric nanogenerator, instead of supply voltage of a gate electrode in traditional transistor, is used as a gate signal, to achieve a direct interaction between mechanical pressure and electronic device, and to have much more wide choices on semiconductor material than piezoelectric transistor.

(3) The entire field-effect transistor is manufactured based on SOI silicon wafer and triboelectric nanogenerator, has simple structure, is easy to integrate, and facilitates miniaturization and array of the device.

(4) The movable friction layer in the triboelectric nanogenerator is served as a pressed part, and the SOI substrate, the gate, the source and the like do not bear the pressure directly, and an elastic element can be used to connect between the movable friction layer and the SOI substrate. Accordingly, the back gate field-effect transistor entirely can bear great mechanical deformation, and has much more wide range of external force sensing compared to piezoelectric transistor.

The invention claimed is:

1. A contact electrification effect-based back gate field-effect transistor, comprising:
    a conductive substrate;
    an insulating layer formed on a front face of the conductive substrate;
    a field-effect transistor assembly comprising: a channel layer formed above the insulating layer, a drain and a source formed above the channel layer, and a gate formed on a back face of the conductive substrate; and
    a triboelectric nanogenerator assembly comprising: a static friction layer formed at a lower surface of the gate, a movable friction layer disposed opposite to the static friction layer and a second electro-conductive layer formed at an outside of the movable friction layer and being electrically connected to the source;
    wherein, the static friction layer and the movable friction layer are made of materials which are in different ratings in triboelectric series, and the static friction layer and the movable friction layer are configured to be switchable between a separated state and a contact state under the action of an external force.

2. The back gate field-effect transistor of claim 1, wherein, the drain and the source are separated by a preset distance to maintain a preset potential difference there between;
    in the contact state, the static friction layer and the movable friction layer are contacted with each other to produce friction charges;
    in the separated state, the static friction layer and the movable friction layer are separated so that the friction charges generate a potential difference between the second electro-conductive layer and the source and thus an electron flow is generated between the second electro-conductive layer and the source while a potential difference is generated between the second electro-conductive layer -and the gate to change a channel width of the channel layer, thereby adjusting an electric current between the source and the drain.

3. The back gate field-effect transistor of claim 1, wherein, a material for one of the static friction layer and the movable friction layer comprises metal material, metal alloy material or conductive oxide material.

4. The back gate field-effect transistor of claim 3, wherein, the gate is made of metal material, metal alloy material or conductive oxide material, and is concurrently served as the static friction layer; and/or
the movable friction layer is made of metal material, metal alloy material or conductive oxide material, and is concurrently served as the second electro-conductive layer.

5. The back gate field-effect transistor of claim 3, wherein, the metal material comprises gold, silver, platinum, aluminum, nickel, copper, titanium or chromium;
the conductive oxide material comprises indium tin oxide (ITO) or aluminum doped zinc oxide AZO; and
the metal alloy material comprises an alloy made of at least two of the following: gold, silver, platinum, aluminum, nickel, copper, titanium and chromium.

6. The back gate field-effect transistor of claim 3, wherein, the other one of the static friction layer and the movable friction layer is made of insulating material or semiconductor material.

7. The back gate field-effect transistor of claim 6, wherein, the insulating material comprises one or more of the following: aniline formaldehyde resin, polyformaldehyde, ethyl cellulose, polyamide 11, polyamide 6-6, woven fabric and wool, silk and its fabric, paper, polyethylene glycol two Ding ester, cellulose, cellulose acetate, polyethylene glycol adipate, poly(diallyl phthalate), regenerated cellulose sponge and cotton fabrics, polyurethane elastomer, styrene acrylonitrile copolymer, styrene-butadiene copolymer, wood, hard rubber, synthetic fiber, acetate, poly(methyl methacrylate), polyvinyl alcohol, polyester, polyisobutylene, polyurethane sponge, polyethylene glycol terephthalate, polyvinyl butyral, butadiene-acrylonitrile copolymer, chloroprene rubber, natural rubber, polyacrylonitrile, poly(vinylidene chloride-co-acrylonitrile), polybisphenol A carbonate, chlorinated polyether, polyvinylidene chloride, poly (2,6-dimethyl phenylene oxide), polystyrene, polyethylene, polypropylene, polydiphenylpropane carbonate, polyethylene glycol terephthalate, polyimide, poly (vinyl chloride), polydimethylsiloxane, poly chlorotrifluoroethylene, PTFE, Perry forest, including Perry Lin C, Perry forest N, Perry Lin D, Perry Lin HT and Perry Lin AF4; and
the semiconductor material comprises one or more of the following materials: silicon, germanium, group III and V compounds, group II and group VI compounds, solid solution composed of group III-V compounds and group II-VI compounds, glass semiconductor, organic semiconductor, semiconductor oxide and complex oxide.

8. The back gate field-effect transistor of claim 1, wherein, the movable friction layer and the static friction layer are separated by the preset distance by means of the following way:
disposing an elastic component between the static friction layer and the movable friction layer;
disposing an elastic or a non-elastic component between the static friction layer and the movable friction layer; or
disposing a connection component between the static friction layer and the movable friction layer.

9. The back gate field-effect transistor of claim 8, wherein, the elastic component comprises an elastic rubber component, a spring or a simple beam structure.

10. The back gate field-effect transistor of claim 1, wherein,
the insulating layer comprises $SiO_2$ at an upper layer of an SOI substrate; and
the conductive substrate comprises Si material, which is N doped or P doped, of a lower layer of the SOI substrate.

11. The back gate field-effect transistor of claim 1, wherein, the channel layer comprises a semiconductor material which is P doped or N doped, having a resistivity $\rho$ in a range of $1\ \Omega \cdot cm \leq \rho \leq 100\ \Omega \cdot cm$.

12. The back gate field-effect transistor of claim 1, wherein, the drain and the source are made of metallic or non-metallic conductor material.

13. The back gate field-effect transistor of claim 1, wherein, a contact of the source and the drain with the channel layer is Ohmic contact or Schottky contact, in which the source is grounded and a voltage V at the drain satisfies $1V \leq V \leq 10V$.

14. The back gate field-effect transistor of claim 1, wherein, a distance L separated from the static friction layer to the movable friction layer satisfies $0 \leq L \leq 800\ \mu m$.

15. The back gate field-effect transistor of claim 14, wherein, the distance L satisfies $0 \leq L \leq 80\ \mu m$.

* * * * *